United States Patent [19]

Howell et al.

[11] Patent Number: 5,391,253
[45] Date of Patent: Feb. 21, 1995

[54] APPARATUS FOR FORMING LAMINATES

[76] Inventors: Richard E. Howell, 9000 Belle Haven Ave. Northeast, Albuquerque, N. Mex. 87112; Weldon M. Johnson, 5220 Byers, Fort Worth, Tex. 76107

[21] Appl. No.: 88,763

[22] Filed: Jul. 8, 1993

Related U.S. Application Data

[62] Division of Ser. No. 744,344, Aug. 13, 1991, Pat. No. 5,256,235.

[51] Int. Cl.⁶ .................... B32B 31/20; B30B 5/00
[52] U.S. Cl. ..................... 156/382; 100/90; 100/93 P; 156/583.1; 156/494; 425/388
[58] Field of Search ............. 156/382, 583.1, 494, 156/229, 286, 285, 580; 100/90, 93 P; 219/243; 425/388; 264/510, 511, 102

[56] References Cited

U.S. PATENT DOCUMENTS

| | | | |
|---|---|---|---|
| 2,730,281 | 1/1956 | Prohaska | 100/90 |
| 2,978,806 | 4/1961 | Herbert, Jr. | |
| 2,990,872 | 7/1961 | Gaby | 100/93 P |
| 3,817,806 | 6/1974 | Anderson et al. | |
| 3,936,336 | 2/1976 | Phillips | 156/229 X |
| 4,078,962 | 3/1978 | Krueger | |
| 4,290,838 | 9/1981 | Reavill et al. | |
| 4,777,721 | 10/1988 | Choinski | 156/382 X |
| 4,806,195 | 2/1989 | Namysl | |
| 4,884,601 | 12/1989 | Hatakeyama | 100/90 X |
| 5,108,532 | 4/1992 | Thein et al. | |
| 5,182,121 | 1/1993 | Miyashita | 156/382 |

FOREIGN PATENT DOCUMENTS

| | | |
|---|---|---|
| 61-24426 | 2/1986 | Japan . |
| 61-255837 | 11/1986 | Japan . |
| 61-290036 | 12/1986 | Japan . |

Primary Examiner—Michael W. Ball
Assistant Examiner—Michele K. Yoder
Attorney, Agent, or Firm—James E. Bradley

[57] ABSTRACT

A press forms a long, thin laminated strip of plastic, metal and fiberglass. The uncured laminate will be laid up in a housing which has sidewalls and a base. A partition is placed over the laminate. The partition seals to sidewalls of the housing and is moveable relative to the housing. The partition divides the cavity of the housing into an upper section and a lower section. The lower section is evacuated. Gas or fluid pressure is applied to the upper section. Heat is applied to the housing to cure the laminate while the pressure is maintained. Tension is applied longitudinally to the laminate during the process.

20 Claims, 2 Drawing Sheets

APPARATUS FOR FORMING LAMINATES

CROSS REFERENCE

This application is a division of application Ser. No. 07/744,344, filed Aug. 13, 1991, now U.S. Pat. No. 5,256,235.

BACKGROUND OF THE INVENTION

1. Field of the Invention

This invention relates in general to the fabrication of thin flexible strips, particularly flexible electrical circuits which are made up of layers of metal, adhesive, and thermoplastic bonded together by heat and pressure.

2. Description of the Prior Art

Thin plastic flexible laminates, often called "flex circuits", are used for transmitting electrical power and signals. A conductive strip will be laminated between thin thermoplastic strips.

Flexible laminated strips of this nature have been constructed in the past by a variety of methods. These include steam presses, heated parallel plates and hydraulic pumps to provide the required temperatures and pressures. Conventional equipment is not available for manufacturing exceptionally long thin flexible laminates.

SUMMARY OF THE INVENTION

The apparatus of this invention is utilized to manufacture a heater strip for an atomic particle collider. The heater strip is a laminate or flexible circuit about 50 feet long and having an overall thickness of only 0.0064 inch. This heater strip has a metal layer as well as multiple films and adhesive layers.

In this invention, the laminate is laid up and placed in an elongated housing having a chamber with sidewalls and a base. A partition will be placed over the laminate. The partition has a perimeter with a seal for sealing to the sidewalls of the chamber. The partition divides the chamber into an upper section and a lower section.

After closing the housing, the lower section is evacuated by a vacuum pump to remove air bubbles from the laminate. Then, pressurized gas or fluid is applied to the upper section of the chamber. This causes the partition to move downward in the chamber to apply pressure to the laminate. Electrical heaters heat the base to cure the resin of the laminate while gas or fluid pressure is maintained. Additionally, a tensioning device will maintain tension on the laminate during the procedure.

DETAILED DESCRIPTION OF THE INVENTION

Figure 1:
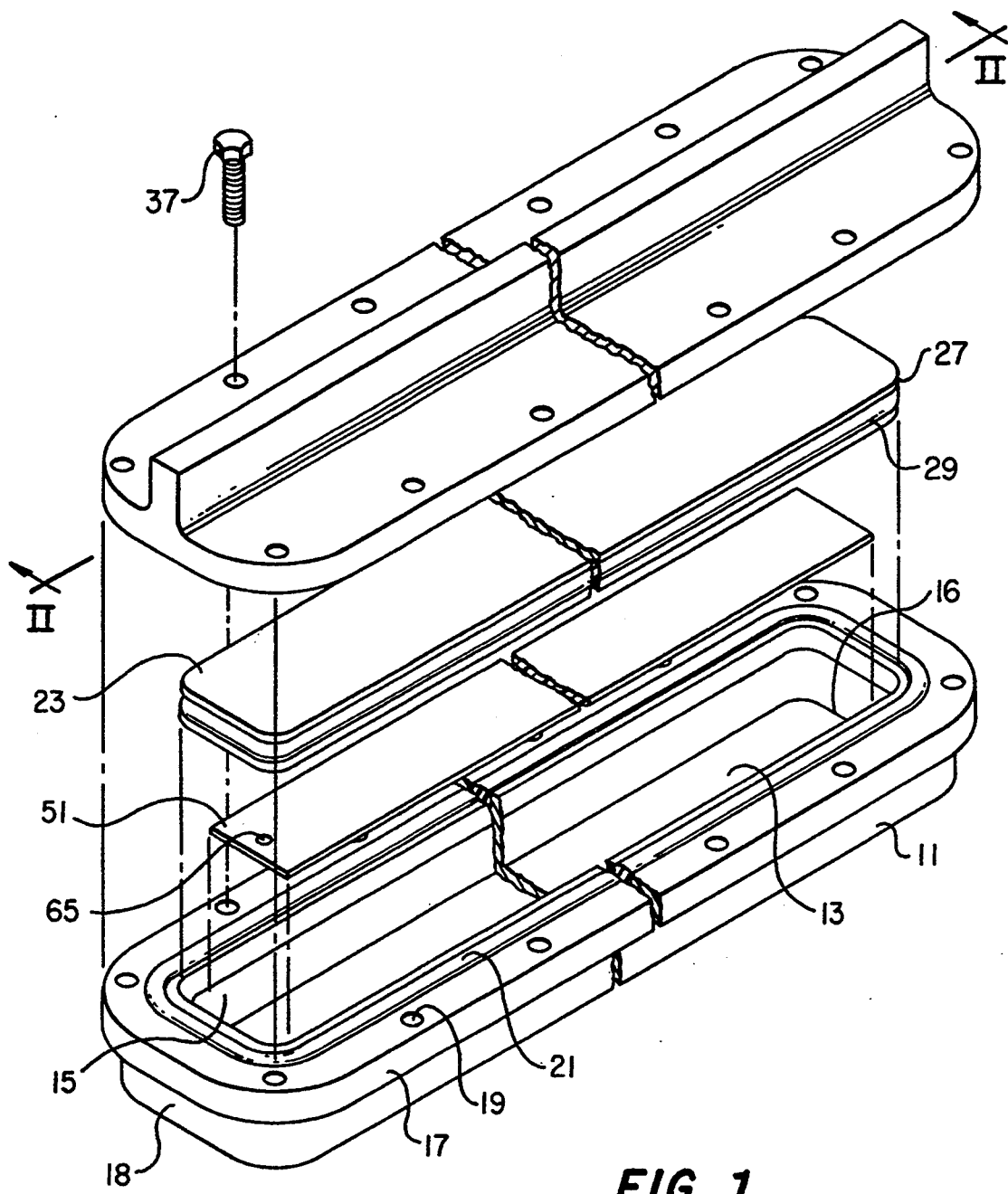
FIG. 1 is an exploded perspective view of an apparatus constructed in accordance with this invention, with a middle section of the apparatus removed.
Figure 2:
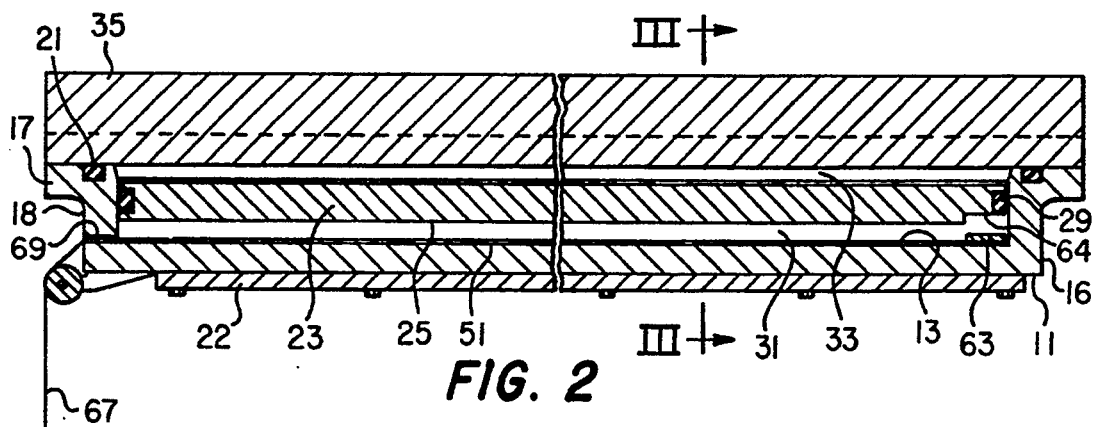
FIG. 2 is a sectional view of the apparatus of FIG. 1 taken along the line II—II of FIG. 1, with the apparatus assembled.
Figure 3:
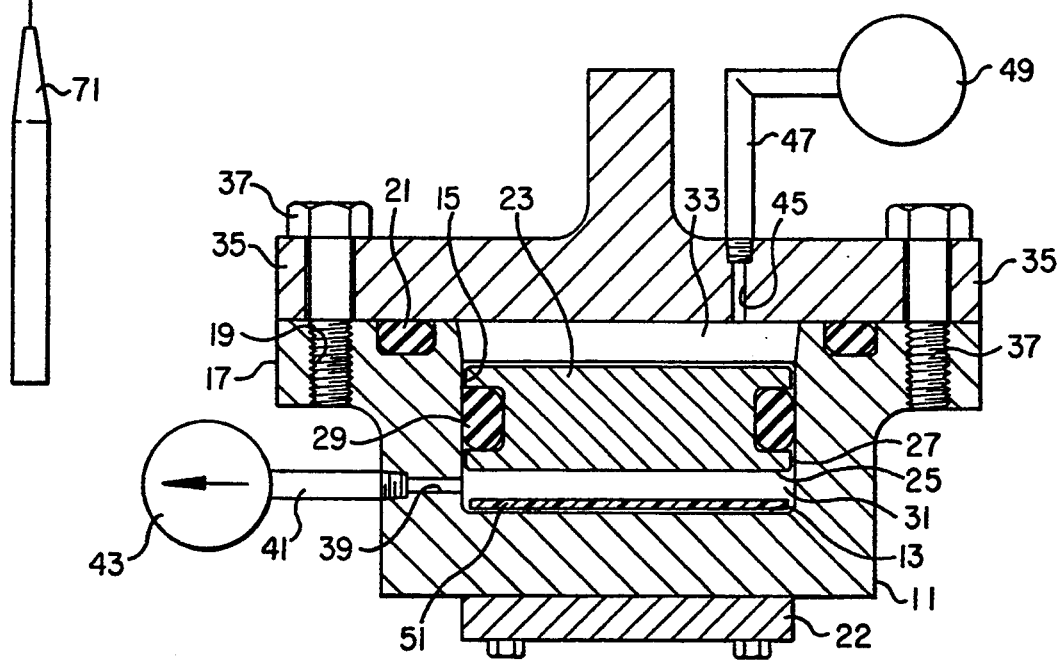
FIG. 3 is a sectional view of the apparatus of FIG. 1, taken along the line III—III of FIG. 2.

Referring to FIGS. 1-3, the apparatus includes an elongated housing 11. Housing 11 is generally rectangular, being only a few inches wide and more than 50 feet long in one embodiment. Housing 11 has an upward facing horizontal base 13. Sidewalls 15 extend upward from the base 13 perpendicular to base 13. Sidewalls 15 extend on both sides of base 13 and on both ends 16, 18 of base 13.

An external flange 17 extends outward from the upper edge of the sidewalls 15. Flange 17 extends completely around both sides and the ends 16, 18 of housing 11. A plurality of holes 19 extend through flange 17. An elastomeric seal 21 locates in a groove provided in the upper surface of flange 17.

A plurality of heaters 22 mount to the lower side of base 13. Heaters 22 are conventional electrical heater elements. When energized, heaters 22 will heat base 13.

A partition 23 is adapted to be positioned in the cavity formed by the base 13 and sidewalls 15. Partition 23 has a width and length that is substantially the same dimension as the cavity formed by the base 13 and sidewalls 15. Partition 23 has a lower planar face 25 (FIG. 3) that faces downward and is spaced above base 13. Partition 23 has a perimeter 27 that extends around partition 23 and is grooved for receiving an elastomeric seal 29. Seal 29 serves as seal means for sealing partition 23 to sidewalls 15. Seal 29 will allow vertical movement of partition 23 relative to sidewalls 15. When installed as shown in FIGS. 2 and 3, partition 23 divides the housing cavity into a lower section 31 and an upper section 33. The sections 31, 33 will be sealed from each other by partition 23 and seal 29.

A top 35 is adapted to mount to the upper surface of flange 17. Bolts 37 extend through holes in the top 35 and into the threaded holes 19 in flange 17 for bolting the top 35 to the housing 11. When bolted in place, seal 21 will seal the upper chamber section 33.

As shown in FIG. 3, an evacuating passage 39 extends through housing 11 from the lower chamber section 31 to the exterior. Evacuating passage 39 extends through one of the sidewalls 15. A conduit 41 secures to threads provided in evacuation passage 39. A vacuum pump 43 connects to conduit 41 to serve as evacuating means for evacuating the lower chamber section 31 of air.

A pressure input passage 45 extends through top 35. A conduit 47 secures to threads provided in input passage 45. A source 49 of pressurized gas connects to conduit 47. Source 49 may be either a container of gas under pressure, such as nitrogen, or it may be a pump connected to a source of gas. Preferably source 49 will maintain a pressure in the upper chamber section 33 of 350 psi.

Figure 4:
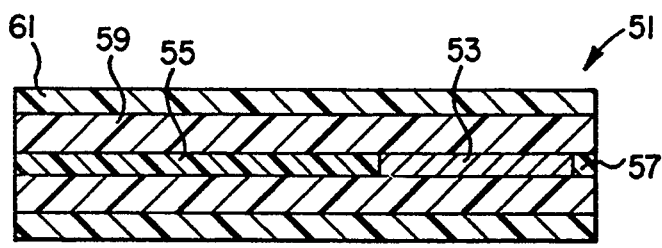
FIG. 4 is an enlarged sectional view of a laminate formed with the apparatus of FIG. 1.

Laminate 51 in the embodiment shown is used as a heating strip within an atomic particle collider. Laminate 51 may have a width that is only slightly less than the width between sidewalls 15. Laminate 51 may have a length that is only slightly less than the distance from end 16 to end 18 of housing 11. As illustrated in FIG. 4, which is greatly exaggerated in thickness, laminate 51 includes a metal strip 53 of stainless steel alternately coated with sections of copper plating. An upper shim 55, preferably of a thermoplastic such as Kapton, locates in the same plane with metal strip 53. A lower shim 57, also Kapton, locates on the opposite edge of metal strip 53.

Adhesive comprising fiberglass cloth 59 with pre-impregnated resin locates on either side of the shims 55, 57 and metal strip 53. Thermoplastic layers 61, preferably of Kapton, enclose the fiberglass cloth layers 59. In the embodiment shown, the overall thickness after bonding of the laminate 51 is preferably about 0.0064 inch within tolerances of plus or minus 0.0005 inch.

Referring again to FIG. 2, a clamp 63 will fit at end 16 of housing 11 within the lower chamber section 31. Clamp 63 may be of a variety of types, and will frictionally clamp one end of laminate 51 to the base 13. Preferably clamp 63 is of a type that has a rotating threaded member for tightening the clamp 63. A recess 64 provided in the end of partition 23 accommodates clamp 63 when the partition 23 is pressed against laminate 51.

An eyelet 65 (FIG. 1) locates at an opposite end of laminate 51. A line 67, shown in FIG. 2, will secure to eyelet 65. Line 67 extends through a small hole 69 in end 18 of housing 11. Line 67 extends downward and secures to a weight 71. Weight 71, line 67, eyelet 65 and clamp 63 cooperate to serve as tensioning means for applying tension along the length of laminate 51 during the process. The hole 69 and the clearances around line 67 are sufficiently small so as to allow a vacuum to be drawn in lower chamber section 31 without significant leakage.

In operation, initially the top 35 will be removed as well as the partition 23. The user will place the various layers of laminate 51 along the base 13 to form the laminate 51 in an uncured condition. Temporary clamps (not shown) may be used along the length of the laminate 51 during the initial layup of the laminate 51. Clamp 63 will be installed at one end of the laminate 51.

The user will thread line 67 through the hole 69 and connect line 67 to the eyelet 65 (FIG. 1). Weight 71 will then apply tension longitudinally along the length of laminate 51.

The operator then inserts the partition 23 into the housing 11. The operator positions the partition 23 above the laminate 51. The operator then installs the top 35 and secures the bolts 37. The operator connects the conduit 41 to evacuating passage 39. The operator connects the conduit 47 to input passage 45. The operator then will evacuate the air from the lower chamber section 31. This procedure will draw any air bubbles from the resin in the laminate 51. The evacuation will also cause the partition 23 to move downward into contact with the laminate. A vacuum of about 22 inches mercury has been found sufficient.

The operator then applies about 300 psi of fluid pressure to the upper chamber section 33 while continuing to maintain the vacuum. The force of the gas pressure will cause the partition 23 to apply pressure to the laminate 51. Simultaneously with the application of gas or fluid pressure, the operator actuates the heater elements 22. The heater elements 22 will heat the base 13 to approximately 425 degrees F. The operator will maintain the vacuum in lower chamber section 31 and the pressure in the upper chamber section 33 while heating. Preferably, the heating procedure lasts about 30 minutes.

Then, in the preferred method, the operator will turn off the vacuum pump 43 and reduce the pressure in the upper pressure section 33 to about 150 PSI. The operator also turns off the heaters 22, allowing the base 13 to cool. Once cooled, the operator removes the top 35 of partition 23 and laminate 51.

The invention has significant advantages. The apparatus and method will provide a thin laminate using pressure and heat. The apparatus can accommodate very long strips. The apparatus is simple in operation and structure.

While the invention has been shown in only one of its forms, it should be apparent to those skilled in the art that it is not so limited, but is susceptible to various changes without departing from the scope of the invention. For example, the top seal and the seal around the partition could be omitted and replaced with a bladder located above the partition. Applying fluid pressure to the bladder would cause downward pressure on the partition.

We claim:

1. An apparatus for forming a laminated strip, comprising in combination:
    an elongated housing having a cavity therein with sidewalls and a base for receiving a laminate with a plurality of layers and a heat curing resin between the layers;
    a partition having a perimeter and a planar face, the face being spaced above the base with the laminate adapted to be sandwiched between the partition and the base, the partition dividing the cavity into an upper section and a lower section;
    seal means for sealing the perimeter of the partition to the sidewalls to seal the upper section of the cavity from the lower section of the cavity;
    closure means for sealingly closing the upper section of the cavity;
    means for evacuating the lower section of the cavity to remove air bubbles from the laminate;
    pressure means for applying fluid pressure to the upper section of the cavity which is greater than ambient atmospheric pressure surrounding the apparatus to apply a force to the partition to apply pressure to the laminate; and
    heating means for heating the base while fluid pressure is maintained to cure the resin of the laminate to cause the layers to bond together.

2. The apparatus according to claim 1 wherein the cavity has a width and a length substantially longer than the width, and wherein the seal means comprises:
    a seal extending around the perimeter of the partition and sealingly and slidingly engaging the sidewalls of the cavity.

3. The apparatus according to claim 1 wherein the cavity has a width and a length substantially longer than the width, the apparatus further comprising means for applying tension to the laminate in a single direction only along the length of the cavity while the laminate is positioned in the lower section of the cavity.

4. The apparatus according to claim 1 further comprising:
    means for clamping one end of the laminate to the housing; and
    a line secured to an opposite end of the laminate and extending out of the housing, and means exterior of the housing for pulling on the line to apply tension to the laminate while the other end of the laminate is clamped to the housing.

5. The apparatus according to claim 1 further comprising:
    means for clamping one end of the laminate to the housing;
    a line secured to an opposite end of the laminate, the line extending through a hole provided in the housing; and
    a weight secured to the line exterior of the housing to apply tension to the laminate.

6. The apparatus according to claim 1 wherein the closure means comprises a top and means for sealingly securing the top to the housing.

7. An apparatus for forming a long, thin laminated strip, comprising in combination:
an elongated housing having a cavity therein with a base for receiving a laminate with a plurality of layers and a heat curing resin between the layers, the cavity having a width and a length substantially longer than the width;
a partition having a planar face, the face being spaced above the base with the laminate adapted to be sandwiched between the partition and the base;
means for evacuating the cavity between the base and the partition to remove air bubbles from the laminate;
tension means for applying tension to the laminate in a single direction only along the length of the cavity while the laminate is wholly positioned in the cavity;
means for applying a force to the partition to apply pressure to the laminate; and
heating means for heating the base while the force is maintained on the partition to cure the resin of the laminate to cause the layers to bond together.

8. The apparatus according to claim 7 wherein the tension means comprises:
means for clamping one end of the laminate to the housing; and
a line secured to an opposite end of the laminate and extending through a hole in the housing out of the housing, and means exterior of the housing for pulling on the line to apply tension to the laminate while the other end of the laminate is clamped to the housing.

9. The apparatus according to claim 7 wherein the tension means comprises:
means for clamping one end of the laminate to the housing;
a line secured to an opposite end of the laminate, the line extending through a hole provided in the housing; and
a weight secured to the line exterior of the housing to apply tension to the laminate.

10. The apparatus according to claim 7 wherein the heating means comprises electrical heating elements mounted to a lower side of the housing.

11. An apparatus for forming a laminated strip, comprising in combination:
an elongated housing having a cavity therein with sidewalls and a base for receiving a laminate with a plurality of layers and a heat curing resin between the layers, the cavity having a width and a length which is substantially longer than the width;
a rigid partition having a perimeter coextensive with the base and a planar face, the face being spaced above the base with the laminate adapted to be sandwiched between the partition and the base, the partition being movable in the cavity toward and away from the base and dividing the cavity into an upper section and a lower section;
seal means comprising a seal extending around the perimeter of the partition for slidingly sealing the perimeter of the partition to the sidewalls of the cavity;
closure means for sealingly closing the upper section of the cavity;
means for evacuating the lower section of the cavity to remove air bubbles from the laminate;
pressure means for applying fluid pressure to the upper section of the cavity to a pressure greater than ambient pressure on the exterior of the housing for applying a force to the partition to move the partition and seal means toward the base to apply pressure to the laminate; and
heating means for heating the base while fluid pressure is maintained to cure the resin of the laminate to cause the layers to bond together.

12. The apparatus according to claim 11 wherein the pressure means comprises:
means for applying a gas pressure to the upper section of the cavity.

13. The apparatus according to claim 11 further comprising means for applying tension to the laminate in a single direction only along the length of the cavity while the laminate is wholly positioned in the lower section of the cavity.

14. The apparatus according to claim 11 further comprising:
means for clamping one end of the laminate to the housing; and
a line secured to an opposite end of the laminate and extending out of the housing, and means exterior of the housing for pulling on the line to apply tension to the laminate in a single direction only along the length of the cavity while the other end of the laminate is clamped to the housing.

15. The apparatus according to claim 11 further comprising:
means for clamping one end of the laminate to the housing;
a line secured to an opposite end of the laminate, the line extending through a hole provided in the housing; and
a weight secured to the line exterior of the housing to apply tension to the laminate in a single direction only along the length of the cavity.

16. The apparatus according to claim 11 wherein the closure means comprises a top and means for sealingly securing the top to the housing.

17. An apparatus for forming a long, thin laminated strip, comprising in combination:
an elongated housing having a cavity having a plurality of sidewalls defining therein with a base for receiving a laminate with a plurality of layers and a heat curing resin between the layers, the base having a width and length which is substantially longer than the width;
a rigid partition having a planar face, the face being spaced above the base with the laminate adapted to be sandwiched between the partition and the base, the partition having a perimeter and a width and length that are substantially the same as the width and length of the base;
an elastomeric seal member extending around the perimeter of the partition in sliding engagement with the sidewalls of the housing;
means for evacuating the cavity between the base and the partition to remove air bubbles from the laminate;
tension means for applying tension to the laminate in a single direction along the length of the base while the laminate is wholly positioned in the cavity;
means for applying fluid pressure to the cavity above the base to a pressure greater than ambient pressure on the exterior of the housing for applying a force to the partition to cause the partition and seal means to move downward in the cavity to apply pressure to the laminate; and heating means for heating the base while pressure is maintained in the cavity above the partition to cure the resin of the laminate to cause the layers to bond together.

18. The apparatus according to claim 17 wherein the tension means comprises:

means for clamping one end of the laminate to the housing; and a line secured to an opposite end of the laminate and extending out of the housing, and means exterior of the housing for pulling on the line to apply tension to the laminate while the other end of the laminate is clamped to the housing.

19. The apparatus according to claim 17 wherein the tension means comprises:

means for clamping one end of the laminate to the housing;

a line secured to an opposite end of the laminate, the line extending through a hole provided in the housing; and a weight secured to the line exterior of the housing to apply tension to the laminate.

20. The apparatus according to claim 17 wherein the heating means comprises electrical heating elements mounted to a lower side of the housing.

* * * * *